(12) United States Patent
Losehand et al.

(10) Patent No.: US 6,551,911 B1
(45) Date of Patent: Apr. 22, 2003

(54) METHOD FOR PRODUCING SCHOTTKY DIODES AND SCHOTTKY DIODES

(75) Inventors: Reinhard Losehand, München (DE); Hubert Werthmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/491,767

(22) Filed: Jan. 26, 2000

Related U.S. Application Data

(63) Continuation of application No. PCT/DE99/01429, filed on May 11, 1999.

(30) Foreign Application Priority Data

May 26, 1998 (DE) .......................................... 198 23 482

(51) Int. Cl.$^7$ .......................... H01L 21/28; H01L 31/07
(52) U.S. Cl. ...................... 438/581; 438/570; 438/573; 257/483; 257/484; 257/485
(58) Field of Search .............................. 438/570–583; 257/471–486

(56) References Cited

U.S. PATENT DOCUMENTS

| | | | | |
|---|---|---|---|---|
| 4,107,719 A | * | 8/1978 | Graul et al. ................ | 257/474 |
| 4,414,737 A | * | 11/1983 | Menjo et al. ............... | 257/484 |
| 4,691,435 A | * | 9/1987 | Anantha et al. ............ | 257/484 |
| 4,796,069 A | * | 1/1989 | Anantha et al. ............ | 257/484 |
| 4,835,580 A | * | 5/1989 | Havemann et al. ......... | 257/478 |
| 5,217,911 A | * | 6/1993 | Denda ........................ | 438/570 |
| 6,066,884 A | * | 5/2000 | Krutsick ..................... | 257/483 |
| 6,448,162 B1 | * | 9/2002 | Losehand et al. .......... | 438/573 |

FOREIGN PATENT DOCUMENTS

| | | |
|---|---|---|
| DE | 3202608 C2 | 12/1988 |
| EP | 0368127 A2 | 5/1990 |
| EP | 0380340 A2 | 8/1990 |

OTHER PUBLICATIONS

Japanese Patent Abstract No. 60157268 (Yoshinori), dated Aug. 17, 1985.
"Method to form recessed oxide–defined high–barrier and low–barrier Schottky diodes", IBM Technical Disclosure Bulletin 31, Nov. 1988, No. 6, Armonk, New York, USA, pp. 478–481.
"The Guard–Ring Termination for the High–Voltage SiC Schottky Barrier Diodes", Katsunori Ueno et al., IEEE Electron Device Letters, vol. 16, No. 7, Jul. 1995, pp. 331–332.
Published International Application No. 91/04581 (Theden), dated Apr. 4, 1991.

* cited by examiner

Primary Examiner—Kevin M. Picardat
(74) Attorney, Agent, or Firm—Laurence A. Greenberg; Werner H. Stemer; Gregory L. Mayback

(57) ABSTRACT

A method for producing Schottky diodes having a protective ring in an edge region of a Schottky contact. The protective ring is produced by a protective ring material that is deposited onto a surface of a semiconductor layer, which surface is provided with a patterned masking layer beforehand, and the protective ring material subsequently being siliconized. In this case, the protective ring material constitutes a metal, in particular a high barrier metal, which has, in particular, platinum.

15 Claims, 1 Drawing Sheet

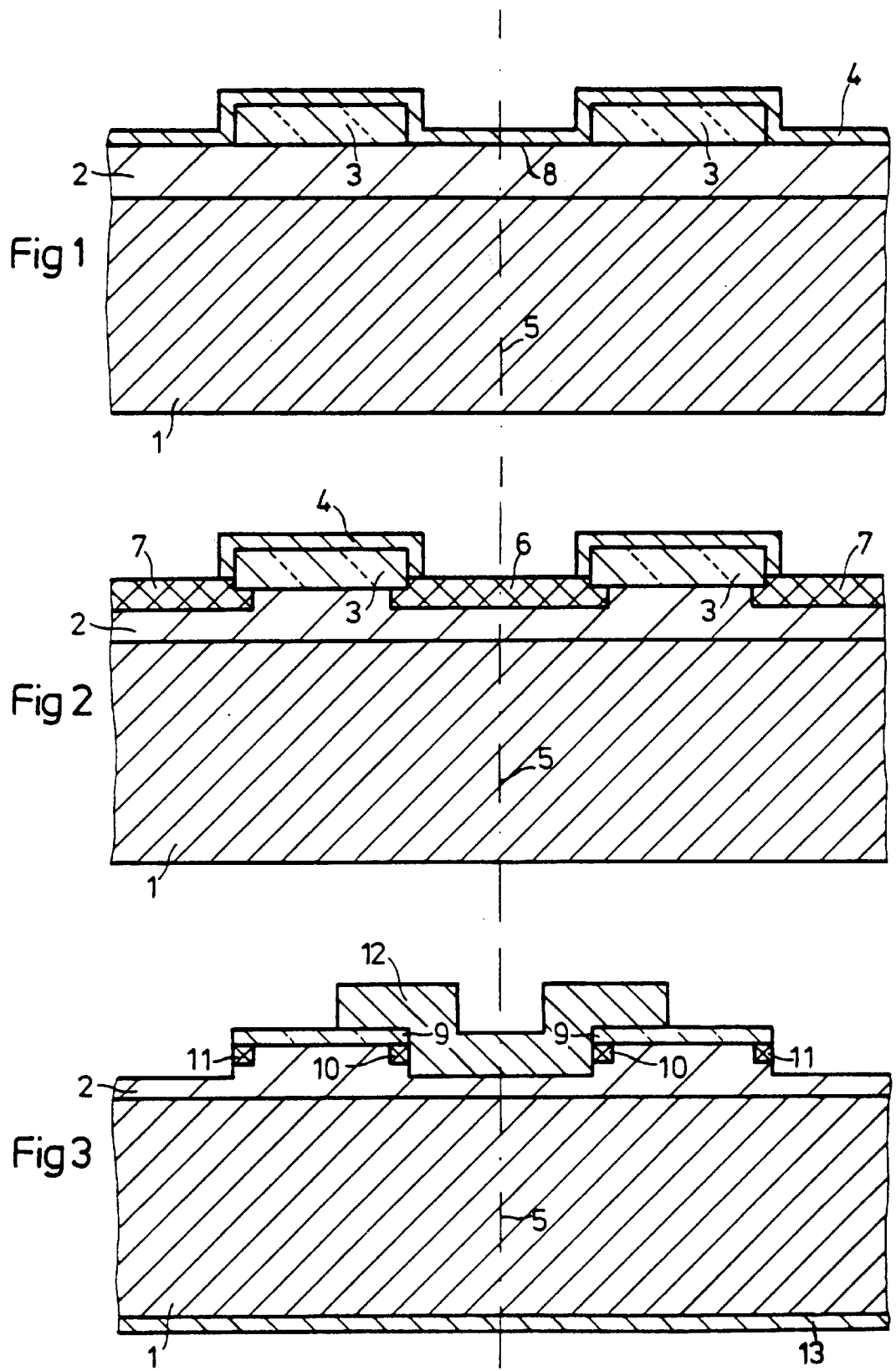

US 6,551,911 B1

METHOD FOR PRODUCING SCHOTTKY DIODES AND SCHOTTKY DIODES

CROSS REFERENCE TO RELATED APPLICATION

This is a continuation of copending International Application PCT/DE99/01429, filed May 11, 1999, which designated the United States.

BACKGROUND OF THE INVENTION

Field of the Invention

The invention relates to a method for producing Schottky diodes having a protective ring in an edge region of Schottky contacts. The invention furthermore relates to a Schottky diode.

During the production of very small-area Schottky diodes, that is to say of Schottky diodes having a diameter of the order of magnitude of 5 to 10 $\mu$m, eliminating the edge effects poses considerable difficulties. It is known to reduce the edge effects by using a protective ring introduced into a semiconductor substrate and/or into a topmost epitaxial layer via implantation technology. In the case of very small-area Schottky diodes, however, a doped protective ring produced by use of photomasks constitutes such a considerable additional capacitance that Schottky diodes produced in such a way cannot be used in relatively high frequency ranges. Applications in the 77 GHz frequency range demand that the Schottky diode have a total capacitance of approximately 40 fF, which permits a parasitic capacitance of at most 10 fF.

SUMMARY OF THE INVENTION

It is accordingly an object of the invention to provide a method for producing Schottky diodes and Schottky diodes which overcome the above-mentioned disadvantages of the prior art methods and devices of this general type, in which the Schottky diode has typical diameters of 5 to 10 $\mu$m and can be used in high-frequency ranges typically of 77 GHz and above.

With the foregoing and other objects in view there is provided, in accordance with the invention, a method for producing Schottky diodes, which includes:

providing a semiconductor layer having a surface for forming a Schottky contact having an edge region;

depositing a patterned masking layer onto the surface of the semiconductor layer;

depositing a protective ring material onto the surface of the semiconductor layer; and siliconizing, subsequently, the protective ring material to form a protective ring in the edge region of the Schotty contact.

The invention provides for the protective ring to be produced by a protective ring material being deposited onto the surface of the semiconductor layer, which surface is provided with a patterned masking layer beforehand, and the protective ring material subsequently being siliconized.

Following the principle of the invention, the protective ring material constitutes a metal, in particular a high barrier metal, which has, in particular, platinum.

The protective ring material is expediently applied by vapor deposition or by being sputtered on.

Other features which are considered as characteristic for the invention are set forth in the appended claims.

Although the invention is illustrated and described herein as embodied in a method for producing Schottky diodes and Schottky diodes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of a semiconductor wafer with a patterned oxide layer mask and deposited protective ring material according to the invention;

FIG. 2 is a sectional view of the semiconductor wafer according to FIG. 1 after the protective ring material has been siliconized; and FIG. 3 is a sectional view of the semiconductor wafer after a deposition and patterning of contact metallization layers.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a substrate 1, which is usually composed of a semiconductor material, with a semiconductor layer 2, which is deposited epitaxially thereon. A patterned masking layer 3 is deposited on the epitaxially deposited semiconductor layer 2, the masking layer 3 constituting a silicon oxide layer having a thickness of approximately 0.5 $\mu$m, and defining an active area of the Schottky diode. A protective ring material layer 4 is deposited on this configuration, with good edge coverage, isotropically with a thickness of approximately 0.1 $\mu$m, which layer 4 is composed of a high barrier metal such as, preferably, platinum. The reference numeral 5 designates an axis of symmetry of the Schottky diode, which is configured to be rotationally symmetrical. The substrate 1 may be composed for example of n$^+$-doped silicon, while the semiconductor layer 2 may be composed of n-doped silicon. The choice of material is not mandatory, however. The substrate 1 and the semiconductor layer 2 may also have the mirror-reversed p-type doping or be composed of a different semiconductor material such as, for example, germanium, gallium arsenide or indium phosphide. The masking layer 3 may be composed of any desired insulator, in particular of silicon oxide.

FIG. 2 shows the semiconductor wafer according to FIG. 1 in which regions of the layer 4 are siliconized within the epitaxial layer 2, thereby producing platinum silicon sections 6 and 7.

In accordance with FIG. 3, anisotropic sputtering etching of the platinum layer 4 ensues preferably perpendicularly to a surface 8 of the semiconductor wafer, a protective ring 10 made of platinum silicide remaining under oxide edges 9.

Finally, according to FIG. 3, a for example platinum-containing Schottky and at the same time contact metallization layer 12 is deposited and patterned. An electrode layer 13 deposited on a rear side of the substrate 1 forms a second terminal of a Schottky contact.

The platinum silicide ring 10 fulfills the requirement of a protective ring for the Schottky diode of the desired application. For a diode diameter of approximately 5 μm, the parasitic capacitance is approximately 5 fF (measured for the voltage U=0 V). An outer ring 11 has no further function.

We claim:

1. A method for producing Schottky diodes, which comprises:
   providing a semiconductor layer having a surface for forming a Schottky contact having an edge region;
   depositing a patterned masking layer onto the surface of the semiconductor layer;
   depositing a protective ring material onto the surface of the semiconductor layer; and
   siliconizing, subsequently, the protective ring material to form a protective ring in the edge region of the Schotty contact.

2. The method according to claim 1, which comprises providing the protective ring material with a metal.

3. The method according to claim 1, which comprises depositing the protective ring material to a thickness of approximately 0.1 μm.

4. The method according to claim 1, which comprises applying the protective ring material by vapor deposition.

5. The method according to claim 1, which comprises providing the patterned masking layer as a silicon oxide layer having a thickness of approximately 0.5 μm.

6. The method according to claim 1, which comprises providing the protective ring material with a high barrier metal.

7. The method according to claim 1, which comprises providing the protective ring material with platinum.

8. The method according to claim 1, which comprises applying the protective ring material by sputtering on.

9. A Schottky diode, comprising:
   a semiconductor layer having a surface for forming a Schottky contact having an edge region;
   a patterned masking layer having a mask edge region and disposed on said surface of said semiconductor layer; and
   a protective ring formed of a siliconized protective ring material and disposed at said mask edge region of said patterned masking layer.

10. The Schottky diode according to claim 9, wherein said siliconized protective ring material includes a high barrier metal.

11. The Schottky diode according to claim 10, wherein said high barrier metal of said protective ring contains platinum.

12. The Schottky diode according to claim 9, wherein said protective ring has a thickness of approximately 0.1 μm.

13. The Schottky diode according to claim 9, wherein said patterned masking layer is formed of a silicon oxide layer.

14. The Schottky diode according to claim 13, wherein said silicon oxide layer has a thickness of approximately 0.2 μm.

15. The Schottky diode according to claim 9, wherein said siliconized protective ring material contains a metal.

* * * * *